(12) United States Patent
Xie et al.

(10) Patent No.: US 9,568,782 B2
(45) Date of Patent: Feb. 14, 2017

(54) DISPLAY PANEL AND DISPLAY DEVICE

(71) Applicants: Xiamen Tianma Micro-Electronics Co., Ltd., Xiamen (CN); Tianma Micro-Electronics Co., Ltd., Shenzhen (CN)

(72) Inventors: Huimin Xie, Xiamen (CN); Hao Wu, Xiamen (CN)

(73) Assignees: XAIMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/678,843

(22) Filed: Apr. 3, 2015

(65) Prior Publication Data
US 2016/0187733 A1 Jun. 30, 2016

(30) Foreign Application Priority Data

Dec. 29, 2014 (CN) .......................... 2014 1 0844739

(51) Int. Cl.
*H01L 27/32* (2006.01)
*G02F 1/1343* (2006.01)
(Continued)

(52) U.S. Cl.
CPC ... *G02F 1/134309* (2013.01); *G02F 1/134336* (2013.01); *H01L 27/326* (2013.01); *H01L 27/3265* (2013.01); *H01L 27/3272* (2013.01); *G02F 1/133345* (2013.01); *G02F 1/133512* (2013.01); *G02F 1/133514* (2013.01);
(Continued)

(58) Field of Classification Search
CPC .......................................... G02F 2001/134372
See application file for complete search history.

(56) References Cited

U.S. PATENT DOCUMENTS 7,499,115 B2 * 3/2009 Kumagawa ....... G02F 1/134363
345/94
2002/0131003 A1 9/2002 Matsumoto
(Continued)

FOREIGN PATENT DOCUMENTS

CN 1351325 A 5/2002
CN 1637567 A 7/2005
(Continued)

*Primary Examiner* — Phat X Cao
*Assistant Examiner* — Diana C Vieira
(74) *Attorney, Agent, or Firm* — Anova Law Group, PLLC

(57) ABSTRACT

A display panel having a plurality of pixel units arranged in an array includes an array substrate and a color filter substrate which are arranged opposite to each other. The array substrate includes a first electrode, and multiple second electrodes arranged corresponding to the respective pixel units, the first electrode and second electrodes are insulated from each other by an insulation layer; and the color filter substrate includes multiple black matrixes and multiple color resists arranged corresponding to the respective pixel units. The array substrate further includes multiple third electrodes arranged in boundary areas between two adjacent pixel units and opposite to the black matrixes. The third electrodes and the first electrode are disposed in different layers and have a same potential.

13 Claims, 4 Drawing Sheets

(51) Int. Cl.
*G02F 1/1333* (2006.01)
*G02F 1/1335* (2006.01)
(52) U.S. Cl.
CPC ............ *G02F 2001/134372* (2013.01); *G02F 2001/134381* (2013.01)

(56) References Cited

U.S. PATENT DOCUMENTS

| | | | |
|---|---|---|---|
| 2005/0052603 A1 | 3/2005 | Jin | |
| 2014/0267955 A1* | 9/2014 | Hibayashi | G06F 3/0412 349/12 |
| 2014/0333880 A1* | 11/2014 | Zhang | G02F 1/134363 349/138 |
| 2015/0162386 A1* | 6/2015 | Furuie | H01L 51/525 257/40 |

FOREIGN PATENT DOCUMENTS

| | | |
|---|---|---|
| CN | 102937760 A | 2/2013 |
| CN | 103913904 A | 7/2014 |

* cited by examiner

DISPLAY PANEL AND DISPLAY DEVICE

CROSS-REFERENCES TO RELATED APPLICATIONS

This application claims the benefit of priority to Chinese Patent Application No. 201410844739.0, filed with the Chinese Patent Office on Dec. 29, 2014 and entitled "DISPLAY PANEL AND DISPLAY DEVICE", the content of which is incorporated herein by reference in its entirety.

FIELD

The present disclosure relates to the field of display technologies, and more particularly to a display panel and a display device.

BACKGROUND OF THE INVENTION

Among flat panel display devices, Thin Film Transistor Liquid Crystal Displays (TFT-LCDs) have become predominant in the current market of flat panel displays due to their small volume, low power consumption, low manufacturing cost, radiation-free and other characteristics.

At present, display modes of the TFT-LCDs generally include the Twisted Nematic (TN) mode, the Vertical Alignment (VA) mode, the In-Plane-Switching (IPS) mode, the Fringe Field Switching (FFS) mode, etc.

The FFS mode refers to a liquid crystal display mode with a potentially widen angle of view. As illustrated in FIG. 1A and FIG. 1B, the display panel of the FFS-type TFT-LCD, which is divided into a plurality of pixel units distributed in an array, generally includes an array substrate 1, a color filter substrate 2 and a liquid crystal layer (not illustrated). A common electrode 11 arranged on the array substrate 1 is a plate-shaped electrode, and pixel electrodes 12 arranged on the array substrate 1 are strip-shaped electrodes. The pixel electrodes 12 are isolated from the common electrode 11 by an insulation layer 13 and are arranged opposite to color resists 21 of the color filter substrate 2. Black matrixes 22 are further arranged on the color filter substrate 2 to space adjacent color resists 21 from each other. A voltage is applied to form a parallel electric field between the pixel electrodes 12 and the common electrode 11.

There is a drawback of the prior art above that the pixel units become increasingly smaller in width as pixels in the display panel become more sophisticated, and accordingly the spacing between the adjacent pixel electrodes 12a and 12b of the adjacent pixel units also becomes increasingly smaller, and when the spacing between the pixel electrodes 12a and 12b becomes smaller, liquid crystal molecules below the black matrixes 22 of the color filter substrate 2 may be deflected significantly, thus resulting in a color cast phenomenon on the display device being watched askance, which means an unsatisfactory display effect. In order to address the drawback above, the spacing between the pixel electrodes 12a and 12b is typically designed sufficiently large nevertheless at the cost of a weakened electric field at the edges of the black matrixes 22 so that the deflection of the liquid crystal molecules below the edges of the black matrixes 22 may obviously become smaller, thus lowering the transmittance, and consequently the brightness, at the edges of the black matrixes 22, which still means an unsatisfactory display effect of the display device.

BRIEF SUMMARY OF THE INVENTION

An object of embodiments of the disclosure is to provide a display panel and a display device so as to alleviate a color cast phenomenon on the display device being watched askance without lowering the brightness of the display device being watched non-askance to thereby improve a display effect of the display device.

An embodiment of the disclosure provides a display panel comprising a plurality of pixel units arranged in an array, an array substrate and a color filter substrate which are arranged opposite to each other. The array substrate includes a first electrode, and multiple second electrodes arranged corresponding to the respective pixel units, the first electrode and the second electrodes are insulated from each other by an insulation layer; and the color filter substrate includes multiple black matrixes and multiple color resists arranged corresponding to the respective pixel units;

The array substrate further includes multiple third electrodes arranged in boundary areas between two adjacent pixel units and opposite to the black matrixes. The third electrodes and the first electrode are disposed in a different layer from the first electrode and have a same potential.

In the technical solution according to the embodiment of the disclosure, the array substrate further includes the third electrodes which are at the same potential as the first electrode, and the third electrodes are arranged in the boundary areas between two adjacent pixel units, opposite to the black matrixes and in a layer different from the first electrode. Since the first electrode is at different potential from the second electrodes, and the third electrodes are at the same potential as the first electrode, the electric field can be formed between the third electrodes and adjacent second electrodes to thereby isolate the adjacent second electrodes of the adjacent two pixel units from each other. With this technical solution, the liquid crystal molecules below the black matrixes of the color filter substrate can be reflected less significantly to thereby alleviate a color cast phenomenon on the display device being watched askance. Moreover, the electric field can be formed between the third electrodes and the adjacent second electrodes to deflect the liquid crystal molecules below the edges of the black matrixes more significantly so as to improve the transmittance, and consequentially the brightness, at the edges of the black matrixes. This solution can alleviate a color cast phenomenon on the display device being watched askance without lowering the brightness of the display device being watched non-askance to thereby improve a display effect of the display device as compared with the prior art.

An embodiment of the disclosure further provides a display device including the display panel according to the technical solution above. The display device being watched both askance and non-askance presents a better display effect.

REFERENCE NUMERALS

The Prior Art

1—array substrate; 2—color filter substrate; 11—common electrode; 12, 12a and 12b—pixel electrode; 13—insulation layer; 21—color resist; and 22—black matrix.

The Embodiments of the Disclosure

100—array substrate; 200—color filter substrate; 111—common electrode; 112, 112a and 112b—pixel electrode; 113—insulation layer; 1131—via hole; 114—third electrode; 201—color resist; 202—black matrix; and 202a and 202b—black matrix portion.

DETAILED DESCRIPTION OF THE INVENTION

In order to alleviate a color cast phenomenon on a display device being watched askance without lowering the brightness of the display device being watched non-askance to thereby improve a display effect of the display device, embodiments of the disclosure provide a display panel and a display device. In a technical solution of the disclosure, an array substrate includes third electrodes which are at the same potential as a first electrode, and the third electrodes are arranged in boundary areas between two adjacent pixel units, opposite to black matrixes and at a different layer from the first electrode. An electric field can be formed between the third electrodes and adjacent second electrodes to thereby isolate the adjacent second electrodes of the two adjacent pixel units from each other. With the technical solution, liquid crystal molecules below the black matrixes of a color filter substrate are reflected less significantly to thereby alleviate a color cast phenomenon on the display device being watched askance. Moreover the electric field can be formed between the third electrodes and the adjacent second electrodes to thereby deflect liquid crystal molecules below the edges of the black matrixes more significantly so as to improve the transmittance, and consequentially the brightness, at the edges of the black matrixes.

In order to make the advantages of the technical solution of the disclosure more apparent, the array substrate and the display device according to the disclosure will be described below in details with reference to the drawings.

Figure 1A:
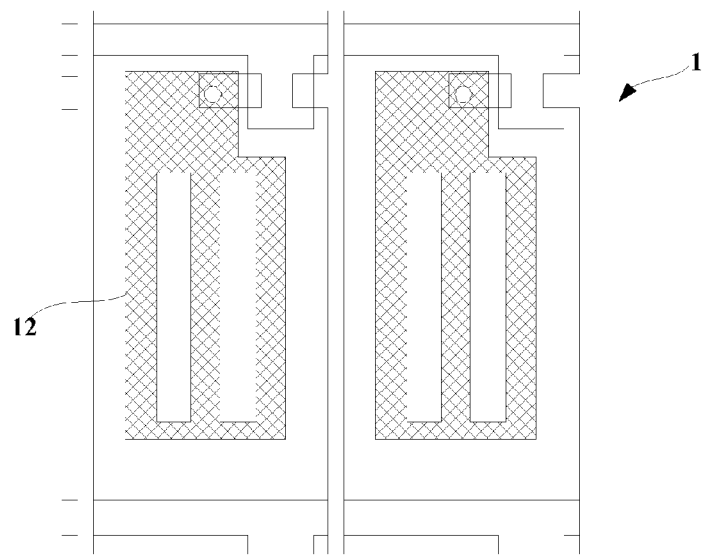
FIG. 1A illustrates a top plan view of an array substrate in a display panel in the prior art.
Figure 1B:
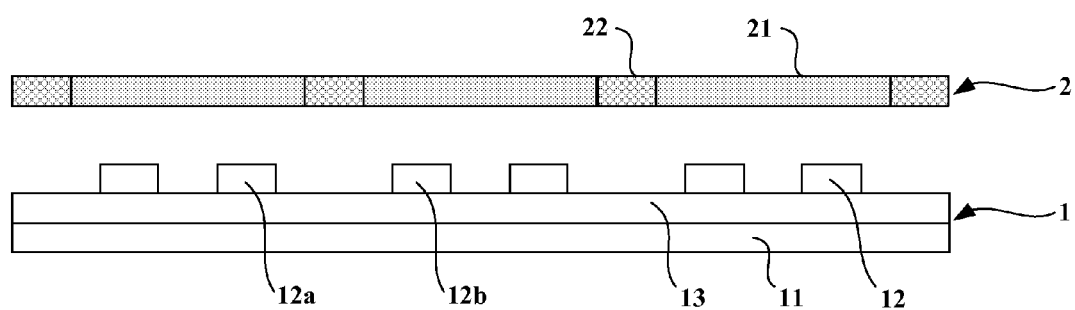
FIG. 1B illustrates a cross-sectional view of pixel units in the display panel in the prior art.
Figure 2A:
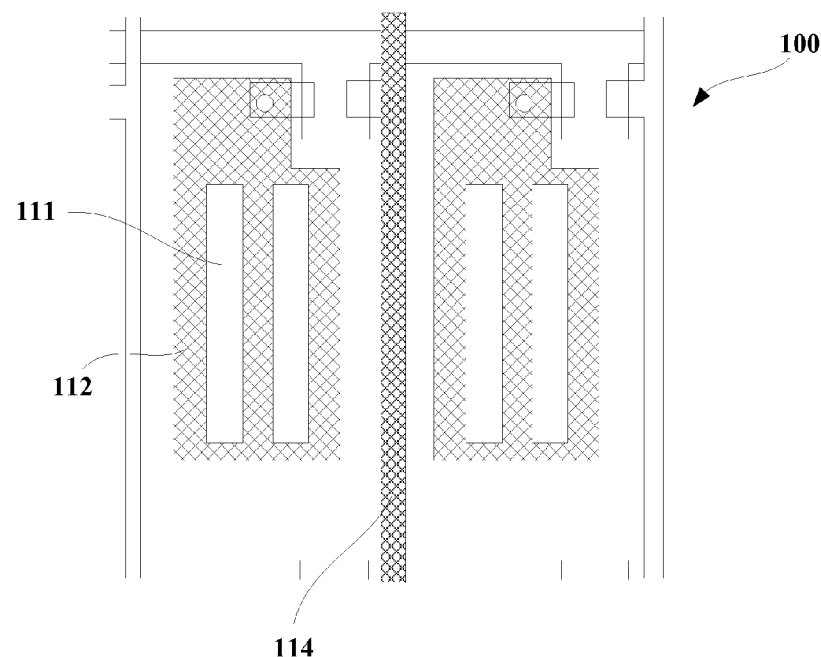
FIG. 2A illustrates a top plan view of an array substrate in a display panel according to a first embodiment of the disclosure.
Figure 2B:
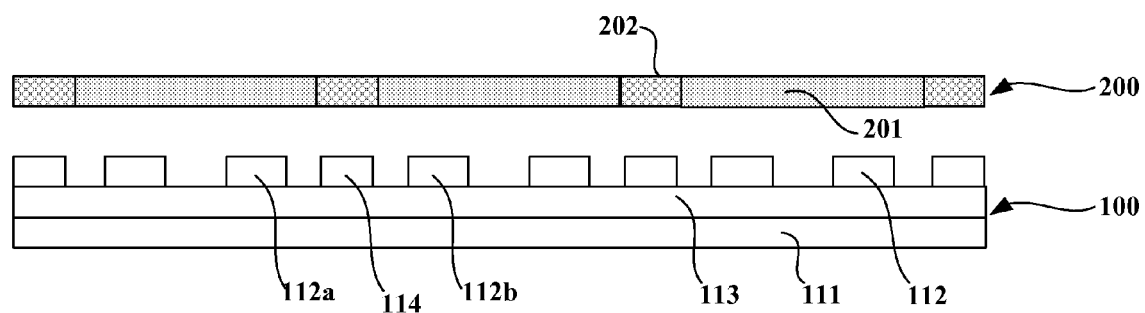
FIG. 2B illustrates a cross-sectional view of pixel units in the display panel according to the first embodiment of the disclosure.

As illustrated in FIG. 2A and FIG. 2B, a display panel according to a first embodiment of the disclosure includes a plurality of pixel units arranged in an array, an array substrate 100 and a color filter substrate 200, which are arranged opposite to each other, and a liquid crystal layer (not illustrated) disposed between the array substrate 100 and the color filter substrate 200. The array substrate 100 includes a first electrode 111, and second electrodes 112 arranged corresponding to the respective pixel units, the first electrode 111 and second electrodes 112 are insulated from each other by an insulation layer 113. The color filter substrate 200 includes black matrixes 202 and color resists 201 arranged corresponding to the respective pixel units. The array substrate 100 further includes multiple third electrodes 114 which are at the same potential as the first electrode 111, and the third electrodes 114 are arranged in boundary areas between two adjacent pixel units, i.e., arranged between adjacent second electrodes 112a and 112b of the two adjacent pixel units, opposite to the black matrixes 202, at a different layer from the first electrode 111.

In the embodiment illustrated in FIG. 2B, the first electrode 111 is a plate-shaped electrode and located on the lower side of the insulation layer 113, i.e., the side of the insulation layer 113 facing away from the color filter substrate 200, and the second electrodes 112 are strip-shaped electrodes and located on the upper side of the insulation layer 113, i.e., the side of the insulation layer 113 facing the color filter substrate 200; and the third electrodes 114 are arranged in the same layer as the second electrodes 112.

Figure 3:
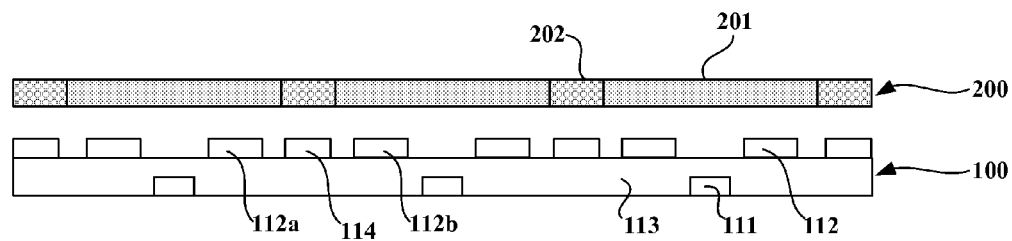
FIG. 3 illustrates a cross-sectional view of pixel units in a display panel according to a second embodiment of the disclosure.

Preferably, in another embodiment, the first electrode 111 and the second electrodes 112 can alternatively be arranged as follows:

In a second embodiment as illustrated in FIG. 3, the first electrode 111 is a strip-shaped electrode and located on the lower side of the insulation layer 113, i.e., the side of the insulation layer 113 facing away from the color filter substrate 200, and the second electrodes 112 are strip-shaped electrodes and located on the upper side of the insulation layer 113, i.e., the side of the insulation layer 113 facing the color filter substrate 200; and the third electrodes 114 are arranged in the same layer as the second electrodes 112.

Figure 4:
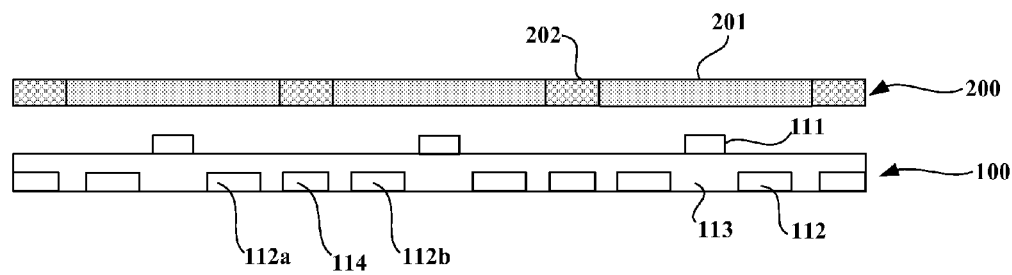
FIG. 4 illustrates a cross-sectional view of pixel units in a display panel according to a third embodiment of the disclosure.

In a third embodiment as illustrated in FIG. 4, the first electrode 111 is a strip-shaped electrode and located on the upper side of the insulation layer 113, i.e., the side of the insulation layer 113 facing the color filter substrate 200, and the second electrodes 112 are strip-shaped electrodes and located on the lower side of the insulation layer 113, i.e., the side of the insulation layer 113 facing away from the color filter substrate 200; and the third electrodes 114 are arranged at the same layer as the second electrodes 112.

In an embodiment of the disclosure, the first electrode 111 and the third electrodes 114 are common electrodes, and the second electrodes 112 are pixel electrodes.

Particularly when the display panel is driven normally, the respective second electrodes 112 are at the same potential, which is different from the potential of the first electrode 111, in the same pixel unit, so that an electric field can be formed between the strip-shaped second electrodes 112 and the first electrode 111 to drive liquid crystal molecules of the liquid crystal layer to be deflected, thus the majority of polarized light can be transmitted out of the panel through the deflected liquid crystal molecules.

In the technical solution according to the embodiment of the disclosure, the third electrodes 114 at the same potential as the first electrode 111 are arranged on the array substrate 100, in the boundary areas between the two adjacent pixel units, opposite to the black matrixes 202 and at a different layer from the first electrode 111. Since the third electrodes 114 are at the same potential as the first electrode 111, which is different from the potential of the second electrodes 112, the electric field can be formed respectively between the third electrodes 114 and the adjacent second electrodes 112a and 112b on both sides thereof to thereby shield an electric field formed between the second electrodes 112a and 112b and the first electrode 111, a part of which is active above the third electrodes 114, thus weakening the electric field above the third electrodes 114; and furthermore since the third electrodes 114 are arranged opposite to the black matrixes 202 of the color filter substrate 200, there is a weaker electric field below the black matrixes 202 to deflect the liquid crystal molecule less significantly, thus alleviating a color cast phenomenon on the display device being watched askance. Moreover the electric field formed respectively between the third electrodes 114 and the second electrodes 112a and 112b on both the sides thereof can deflect the liquid crystal molecules below the edges of the black matrixes 202, thus improving the transmittance, and consequentially the brightness, at the edges of the black matrixes 202.

Figure 5:
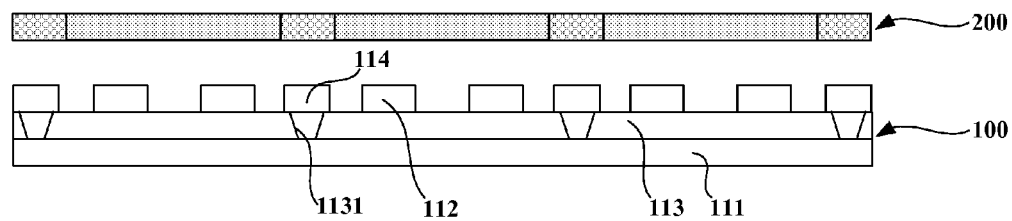
FIG. 5 illustrates a cross-sectional view of pixel units in a display panel according to a fourth embodiment of the disclosure.

Referring to FIG. 5, in order to arrange the first electrode 111 and the third electrodes 114 at the same potential, preferably the insulation layer 113 is provided with via holes 1131 arranged between the first electrode 111 and the third electrodes 114, and the third electrodes 114 are electrically connected with the first electrode 111 through the via holes 1131. This structure is designed to be simple and reliable, and these via holes 1131 can be formed in the same patterning process as other via holes on the insulation layer 113 without adding to a cost of manufacturing the display panel.

In an embodiment of the disclosure, the third electrode is arranged in the boundary area between every two adjacent pixel units. In another embodiment of the disclosure, the third electrodes 114 can alternatively be distributed in the boundary areas between specific pixel units and adjacent pixel units on both sides thereof. For some specific pixel units susceptible to a color cast, the third electrodes 114 can be specifically designed to be distributed at particular locations to thereby alleviate a color cast phenomenon in a picture displayed on the display device in a simplified structural design at a lower production cost.

Figure 6:
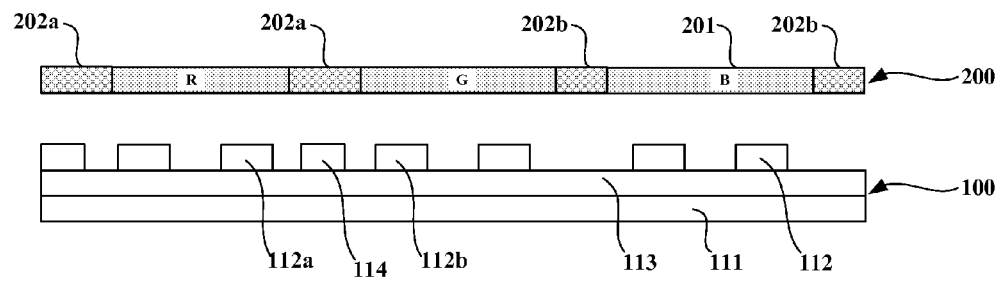
FIG. 6 illustrates a cross-sectional view of pixel units in a display panel according to a fifth embodiment of the disclosure.

As illustrated in FIG. 6, in a preferred embodiment, the color resists 201 of the color filter substrate 200 includes red (R) color resists, green (G) color resists and blue (B) color resists, and the pixel units on the array substrate 100 include pixel units corresponding to the red (R) color resists (R pixel units below), pixel units corresponding to the green (G) color resists (G pixel units below), and pixel units corresponding to the blue (B) color resists (B pixel units below), and since the R pixel units are specific pixel units susceptible to a color cast as compared with the G pixel units and the B pixel units, the third electrodes 114 are designed in this embodiment to be distributed in boundary areas between the R pixel units and adjacent pixel units on both sides thereof, that is, the third electrodes 114 are designed to be distributed in the boundary areas between the R pixel units and the G pixel units, and between the R pixel units and the B pixel units so that the third electrodes 114 are distributed in location corresponding to the black matrixes 202a on both sides of the red (R) color resists to thereby alleviate a color cast phenomenon in a picture displayed on the display device.

Furthermore as illustrated in FIG. 6, the line width of the black matrix portions 202a between the two adjacent pixel units including the specific pixel units (i.e., the R pixel units), i.e., the spacing between the R color resists and the G color resists or between the R color resists and the B color resists in FIG. 6, is larger than the line width of the black matrix portions 202b between the two adjacent pixel units excluding the specific pixel units (i.e., the R pixel units), i.e., the spacing between the G color resists and the B color resists in FIG. 6, in the color filter substrate 200.

With the structural design illustrated in the embodiment of FIG. 6, the transmittance at the edges of the black matrix portions 202a is improved, whereas the transmittance at the edges of the black matrix portions 202b is maintained, so the line width of the black matrix portions 202a is designed larger than the line width of the black matrix portions 202b to thereby make the transmittance uniform throughout the pixel units of the display panel. With this design, the transmittance can be substantially uniform throughout the display panel in the respective areas to thereby alleviate a color cast phenomenon on the display panel without degrading the chroma in a picture displayed on the display panel.

In the embodiment illustrated in FIG. 6, the R pixel units are specific pixel units, and of course, the disclosure will not be limited thereto, other pixel units in another color can also be arranged as specific pixel units as needed in reality to alleviate a color cast phenomenon on the display panel.

Figure 7A:
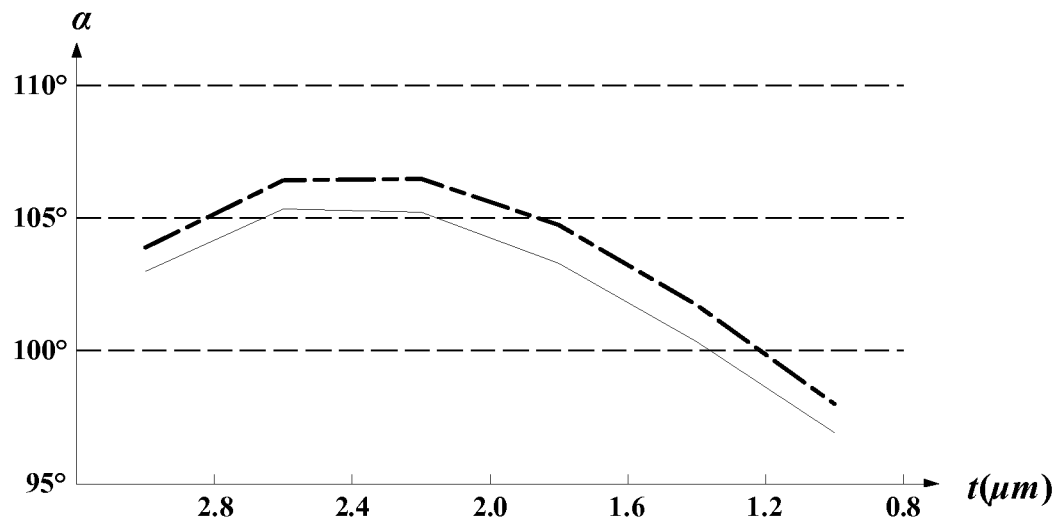
FIG. 7A illustrates α-t graphs of liquid crystal molecules below black matrixes for comparison.

FIG. 7A illustrates graphs of an angle $\alpha$, at which the liquid crystal molecules below the black matrix 202 are deflected, varying with the thickness t of a liquid crystal box where the liquid crystal molecules are located. The solid line represents the $\alpha$-t graph corresponding to the display panel according to the first embodiment of the disclosure, and the dash-dot-line represents the $\alpha$-t graph corresponding to the display panel in the prior art. As can be apparent, the liquid crystal molecules below the black matrixes 202 in the display panel according to the first embodiment of the disclosure can be deflected at a substantially smaller angle than the prior art at the same box thickness coordinate to thereby alleviate a color cast phenomenon on the display panel being watched askance.

Figure 7B:
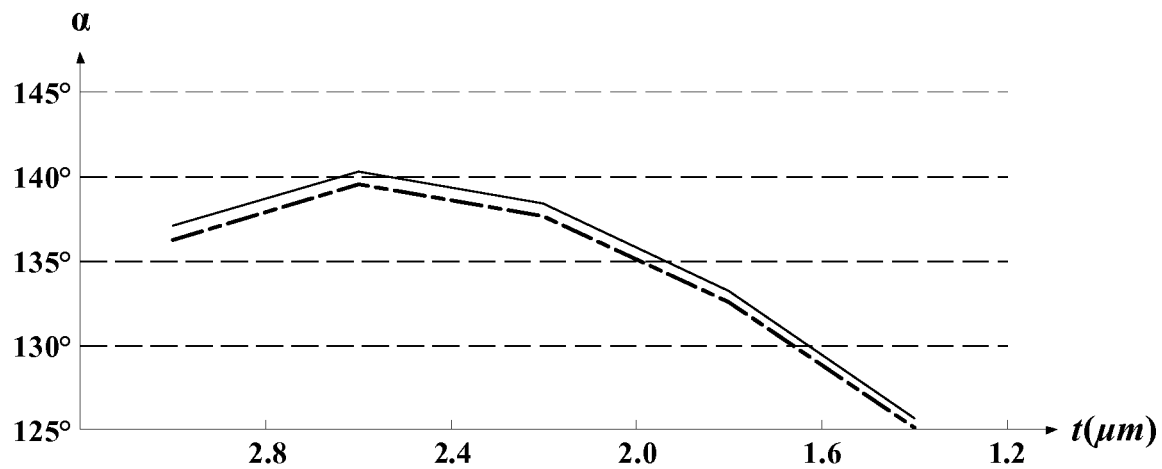
FIG. 7B illustrates α-t graphs of liquid crystal molecules below the edges of the black matrixes for comparison.

FIG. 7B illustrates graphs of an angle $\alpha$, at which the liquid crystal molecules below the edges of the black matrix 202 are deflected, varying with the thickness t of the liquid crystal box where the liquid crystal molecules are located (i.e., the thickness of the liquid crystal layer). The solid line represents the $\alpha$-t graph corresponding to the display panel according to the first embodiment of the disclosure, and the dash-dot-line represents the $\alpha$-t graph corresponding to the display panel in the prior art. As can be apparent, the liquid crystal molecules below the edges of the black matrixes 202 in the display panel according to the first embodiment of the disclosure can be deflected at a substantially larger angle than the prior art at the same box thickness coordinate to thereby improve the transmittance, and consequentially the brightness, at the edges of the black matrixes 202.

The other embodiments of the disclosure can also achieve similar advantageous effects above although $\alpha$-t graphs corresponding to their display panels have been omitted here.

In summary, with the technical solutions according to the respective embodiments, a color cast phenomenon on the display device being watched askance can be alleviated without lowering the brightness of the display device being watched non-askance to thereby improve a display effect of the display device.

An embodiment of the disclosure further provides a display device including the display pane according to the embodiments above. The display device being watched both askance and non-askance presents a better display effect.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

What is claimed is:

1. A display panel comprising a plurality of pixel units arranged in an array, an array substrate and a color filter substrate which are arranged opposite to each other, wherein the color filter substrate comprises:
   a plurality of black matrixes and a plurality of color resists arranged corresponding to the respective pixel units; and
the array substrate comprises:
   a first electrode;
   a plurality of second electrodes arranged corresponding to the respective pixel units, wherein the first electrode and the second electrodes are insulated from each other by an insulation layer; and
   a plurality of third electrodes arranged in boundary areas between two adjacent pixel units and opposite to the black matrixes, wherein the third electrodes and the first electrode are disposed in different layers and have a same potential different from a potential of the second electrodes, such that an electric field is formed between the third electrodes and adjacent second electrodes to thereby isolate the adjacent second electrodes of the adjacent two pixel units from each other.

2. The display panel according to claim 1, wherein the first electrode is located on a lower side of the insulation layer, the second electrodes are located on an upper side of the insulation layer, and the third electrodes and the second electrodes are arranged in a same layer.

3. The display panel according to claim 2, wherein the first electrode is a plate-shaped or strip-shaped electrode and the second electrodes are strip-shaped electrodes.

4. The display panel according to claim 1, wherein the first electrode is located on an upper side of the insulation layer, the second electrodes are located on a lower side of the insulation layer, and the third electrodes and the second electrodes are arranged in a same layer.

5. The display panel according to claim 4, wherein the first electrode and the second electrodes are strip-shaped electrodes.

6. The display panel according to claim 2, wherein the insulation layer comprises a plurality of via holes arranged between the first electrode and the third electrodes, and the third electrodes are electrically connected with the first electrode through the via hole.

7. The display panel according to claim 1, wherein the first electrode and the third electrodes are common electrodes, and the second electrodes are pixel electrodes.

8. The display panel according to claim 1, wherein the third electrode is arranged in a boundary area between every two adjacent pixel units.

9. The display panel according to claim 1, wherein the third electrodes are disposed in the boundary areas between a specific pixel unit and adjacent pixel units on both sides thereof.

10. The display panel according to claim 9, wherein a line width of a black matrix portion corresponding to two adjacent pixel units comprising the specific pixel unit is larger than a line width of a black matrix portion corresponding to two adjacent pixel units excluding the specific pixel unit in the color filter substrate.

11. The display panel according to claim 9, wherein the color filter substrate comprises a plurality of color resists comprising a red color resist, and the specific pixel unit comprises a pixel unit corresponding to the red color resist.

12. The display panel according to claim 4, wherein the insulation layer comprises a plurality of via holes arranged between the first electrode and the third electrodes, and the third electrodes are electrically connected with the first electrode through the via holes.

13. A display device with a display panel having a plurality of pixel units arranged in an array, the display panel comprising an array substrate and a color filter substrate which are arranged opposite to each other,
   wherein the color filter substrate comprises:
      a plurality of black matrixes and a plurality of color resists arranged corresponding to the respective pixel units; and
   the array substrate comprises:
      a first electrode;
      a plurality of second electrodes arranged corresponding to the respective pixel units, wherein the first electrode and the second electrodes are insulated from each other by an insulation layer;
      a plurality of third electrodes arranged in boundary areas between two adjacent pixel units and opposite to the black matrixes, wherein the third electrodes and the first electrode are disposed in different layers and have a same potential different from a potential of the second electrodes, such that an electric field is formed between the third electrodes and adjacent second electrodes to thereby isolate the adjacent second electrodes of the adjacent two pixel units from each other.

* * * * *